United States Patent
Han

(10) Patent No.: US 12,402,304 B2
(45) Date of Patent: Aug. 26, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Qinghua Han, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 429 days.

(21) Appl. No.: 18/153,459

(22) Filed: Jan. 12, 2023

(65) Prior Publication Data
US 2023/0354584 A1    Nov. 2, 2023

(30) Foreign Application Priority Data
Apr. 29, 2022 (CN) .......................... 202210467904.X

(51) Int. Cl.
*H10B 12/00* (2023.01)
*H10D 30/67* (2025.01)

(52) U.S. Cl.
CPC .......... *H10B 12/482* (2023.02); *H10B 12/05* (2023.02); *H10B 12/488* (2023.02); *H10D 30/6735* (2025.01)

(58) Field of Classification Search
CPC .................................................. H10B 12/482
See application file for complete search history.

(56) References Cited

U.S. PATENT DOCUMENTS

| | | | |
|---|---|---|---|
| 8,912,604 B2 | 12/2014 | Myung et al. | |
| 2012/0299088 A1* | 11/2012 | Heineck | H10D 30/477 257/E21.135 |
| 2013/0146958 A1* | 6/2013 | Kim | H10B 12/488 257/E29.345 |
| 2023/0010014 A1* | 1/2023 | Shao | H01L 21/76224 |
| 2023/0013070 A1* | 1/2023 | Shao | H10B 12/482 |
| 2023/0013215 A1* | 1/2023 | Huang | H01L 21/76283 |
| 2023/0014259 A1* | 1/2023 | Shao | G11C 5/063 |

(Continued)

FOREIGN PATENT DOCUMENTS

CN        103681599 A       3/2014

OTHER PUBLICATIONS

Copending U.S. Appl. No. 17/934,679, filed 2022.*

(Continued)

*Primary Examiner* — Lauren R Bell
(74) *Attorney, Agent, or Firm* — SYNCODA LLC; Feng Ma

(57) ABSTRACT

Embodiments of the present disclosure relate to a semiconductor structure and a manufacturing method thereof. The method of manufacturing a semiconductor structure includes: providing a substrate; etching the substrate to form a plurality of body structures arranged at intervals in a first direction, wherein a space between adjacent ones of the body structures is filled with a first isolation layer, each of the body structures includes a body layer and a plurality of body pillars that are discrete and are located on the body layer, the plurality of body pillars are arranged at intervals along a second direction, and the first direction is different from the second direction; etching a part of the body layer between adjacent ones of the body pillars, to form a plurality of openings in the body layer; and siliconizing the body layer through the plurality of openings.

13 Claims, 15 Drawing Sheets

(56) References Cited

U.S. PATENT DOCUMENTS

| | | | |
|---|---|---|---|
| 2023/0020232 A1* | 1/2023 | Shao | H10B 12/482 |
| 2023/0380146 A1* | 11/2023 | Xiao | H10B 12/482 |
| 2023/0422480 A1* | 12/2023 | Yan | H10B 12/482 |
| 2024/0023317 A1* | 1/2024 | Shao | H10B 12/482 |
| 2024/0049453 A1* | 2/2024 | Shao | H10B 12/488 |

OTHER PUBLICATIONS

Copending U.S. Appl. No. 18/171,284, filed 2023.*
Copending U.S. Appl. No. 17/954,467, filed 2022.*
Copending U.S. Appl. No. 17/952,294, filed 2022.*
Copending U.S. Appl. No. 17/952,208, filed 2022.*
Copending U.S. Appl. No. 17/951,077, filed 2022.*
Copending U.S. Appl. No. 17/934,672, filed 2022.*

* cited by examiner

SEMICONDUCTOR STRUCTURE AND MANUFACTURING METHOD THEREOF

CROSS-REFERENCE TO RELATED APPLICATION

This application claims the priority of Chinese Patent Application No. 202210467904.X, submitted to the Chinese Intellectual Property Office on Apr. 29, 2022, the disclosure of which is incorporated herein in its entirety by reference.

TECHNICAL FIELD

Embodiments of the present disclosure relate to the technical field of integrated circuit design and manufacturing, and in particular, to a semiconductor structure and a manufacturing method thereof.

BACKGROUND

With the higher level of integration and performance of memory, a vertical gate-all-around (VGAA) transistor can effectively reduce the size of the memory. It is important to ensure the reliable performance of the memory with VGAA transistors.

SUMMARY

A first aspect of the embodiments of the present disclosure provides a method of manufacturing a semiconductor structure, including: providing a substrate; etching the substrate to form a plurality of body structures arranged at intervals in a first direction, wherein a space between adjacent ones of the body structures is filled with a first isolation layer, each of the body structures includes a body layer and a plurality of body pillars that are discrete and are located on the body layer, the plurality of body pillars are arranged at intervals along a second direction, and the first direction is different from the second direction; etching a part of the body layer between adjacent ones of the body pillars, to form a plurality of openings in the body layer; and siliconizing the body layer through the plurality of openings to form a metal silicide that is continuous along the second direction, so as to form a plurality of bit lines, each of the bit lines being in a corresponding body layer.

The embodiments of the present disclosure further provide a semiconductor structure, including: a substrate; a plurality of body structures arranged at intervals along a first direction, wherein a space between adjacent ones of the body structures is filled with a first isolation layer, each of the body structures includes a body layer and a plurality of body pillars that are discrete and are located on the body layer, the plurality of body pillars are arranged at intervals along a second direction, and a part of the body layer between adjacent ones of the body pillars is provided with openings; and a plurality of bit lines, each of the bit lines including a metal silicide that is located in a corresponding body layer and extends along the second direction.

BRIEF DESCRIPTION OF THE DRAWINGS

To better describe and illustrate the embodiments and/or examples of the present disclosure, reference may be made to one or more accompanying drawings. Additional details or examples for describing the drawings should not be considered as limitations on the scope of any one of the present disclosure, the currently described embodiment and/or example, and the optimal mode of the present disclosure as currently understood.

REFERENCE NUMERALS

Figure 1:
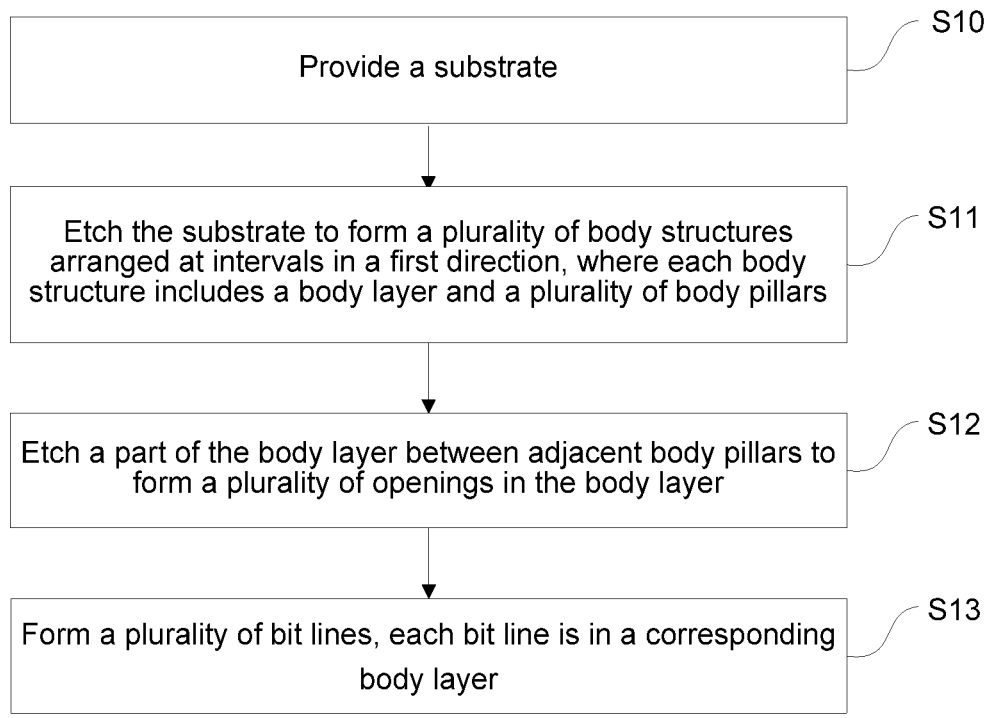
FIG. 1 is a flowchart of a method of manufacturing a semiconductor structure according to an embodiment of the present disclosure.

100: substrate; 101: first patterned mask layer; 102: first trench; 201: second patterned mask layer; 202: second trench; 10: body structure; 11: body layer; 11*a*: opening; 12: body pillar; 13: protective layer; 13*a*: gap; 20: first isolation layer; 30: bit line; 40: VGAA transistor; 41: gate; 411: gate dielectric layer; 412: gate conductive layer; 50: word line; 60: second isolation layer; 70: third isolation layer; 80: fourth isolation layer.

DETAILED DESCRIPTION

To facilitate the understanding of the present disclosure, the present disclosure is described more completely below with reference to the related accompanying drawings. The preferred embodiments of the present disclosure are shown in the accompanying drawings. However, the present disclosure may be embodied in various forms without being limited to the embodiments described herein. On the contrary, these embodiments are provided to make the present disclosure more thorough and comprehensive.

Unless otherwise defined, all technical and scientific terms used in the specification have the same meaning as commonly understood by those skilled in the technical field of the present disclosure. The terms used in the specification of the present disclosure are merely for the purpose of describing specific embodiments, rather than to limit the present disclosure. The term "and/or" used herein includes any and all combinations of one or more of the associated listed items.

It should be noted that, the drawings provided in the embodiments merely illustrate the basic concepts of the present disclosure schematically. Although the drawings only show components related to the present disclosure rather than being drawn according to the quantities, shapes, and sizes of components in actual implementation, patterns, quantities, and proportions of components in actual implementation may be changed randomly, and the component layout may be more complex.

Embodiments of the present disclosure provide a semiconductor structure and a manufacturing method thereof. A continuous metal silicide is formed in a substrate to serve as a buried bit line, to reduce the resistance of the semiconductor structure and improve the performance of the semiconductor structure. The semiconductor structure is applicable to a VGAA transistor, to effectively reduce the size of a memory and improve the level of integration and performance of the memory.

The embodiments of the present disclosure provide a method of manufacturing a semiconductor structure, which is described in detail below with reference to the drawings. FIG. 1 to FIG. 23 are schematic structural diagrams corresponding to a method of manufacturing a semiconductor structure according to an embodiment of the present disclosure. It should be noted that, to conveniently describe and clearly illustrate the method of manufacturing a semiconductor structure, the drawings in this embodiment are all partial schematic structural diagrams of the semiconductor structure.

FIG. 2 to FIG. 6 are three-dimensional schematic structural diagrams; FIG. 7 and FIG. 14 are partial cross-sectional views taken along a first direction ox; and FIG. 8 to FIG. 13 are partial cross-sectional views taken along a second direction oy.

Referring to FIG. 1, in some embodiments of the present disclosure, a method of manufacturing a semiconductor structure is provided, which includes:

Step S10: Provide a substrate 100.

Step S11: Etch the substrate 100 to form a plurality of body structures 10 arranged at intervals in a first direction ox, wherein a space between adjacent body structures 10 is filled with a first isolation layer 20, each body structure 10 includes a body layer 11 and a plurality of discrete body pillars 12 located on the body layer 11, the plurality of body pillars 12 are arranged at intervals along a second direction oy, and the first direction ox is different from the second direction oy.

Step S12: Etch a part of the body layer 11 between adjacent body pillars 12 to form a plurality of openings 11a in the body layer 11.

Step S13: Siliconize the body layer 11 through the plurality of openings 11a to form a metal silicide that is continuous along the second direction, so as to form a plurality of bit lines 30, each bit line 30 is in a corresponding body layer 11.

Figure 2:
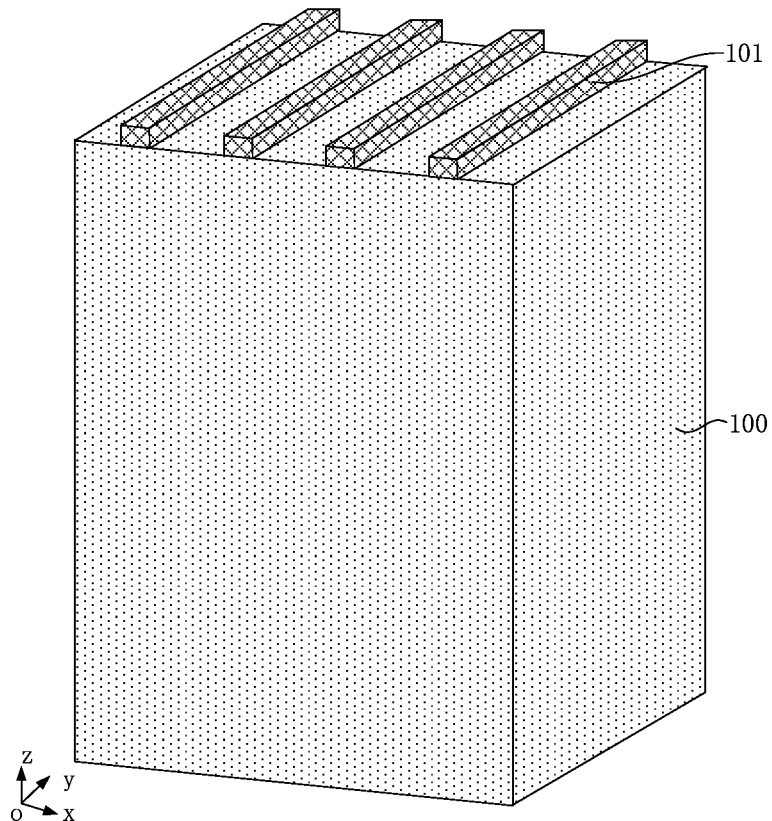
FIG. 2 to FIG. 14 are schematic structural diagrams corresponding to a method of manufacturing a semiconductor structure according to an embodiment of the present disclosure, wherein direction ox is a first direction, direction oy is a second direction, and direction oz is a height/thickness direction.

Referring to FIG. 1 and FIG. 2, in some embodiments of the present disclosure, the substrate 100 provided in step S10 may be formed by a semiconductor base such as silicon wafer. The material of the substrate 100 includes, but is not limited to, monocrystalline silicon, polycrystalline silicon or amorphous silicon; the substrate 100 includes, but is not limited to, a monocrystalline silicon substrate, a polycrystalline silicon substrate, or an amorphous silicon substrate.

Further referring to FIG. 1 to FIG. 4, in step S11, in some embodiments of the present disclosure, a plurality of body structures 10 arranged at intervals along the first direction ox may be formed on the substrate 100 by etching the substrate 100, and a space between adjacent body structures 10 is filled with the first isolation layer 20.

Figure 3:
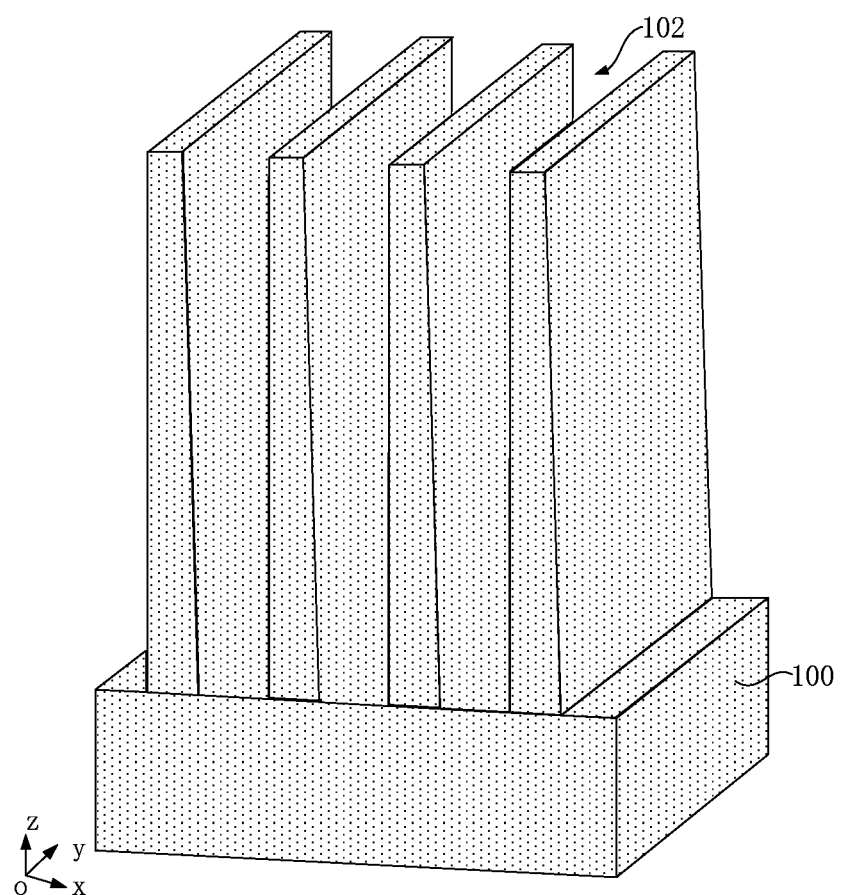
Figure 4:
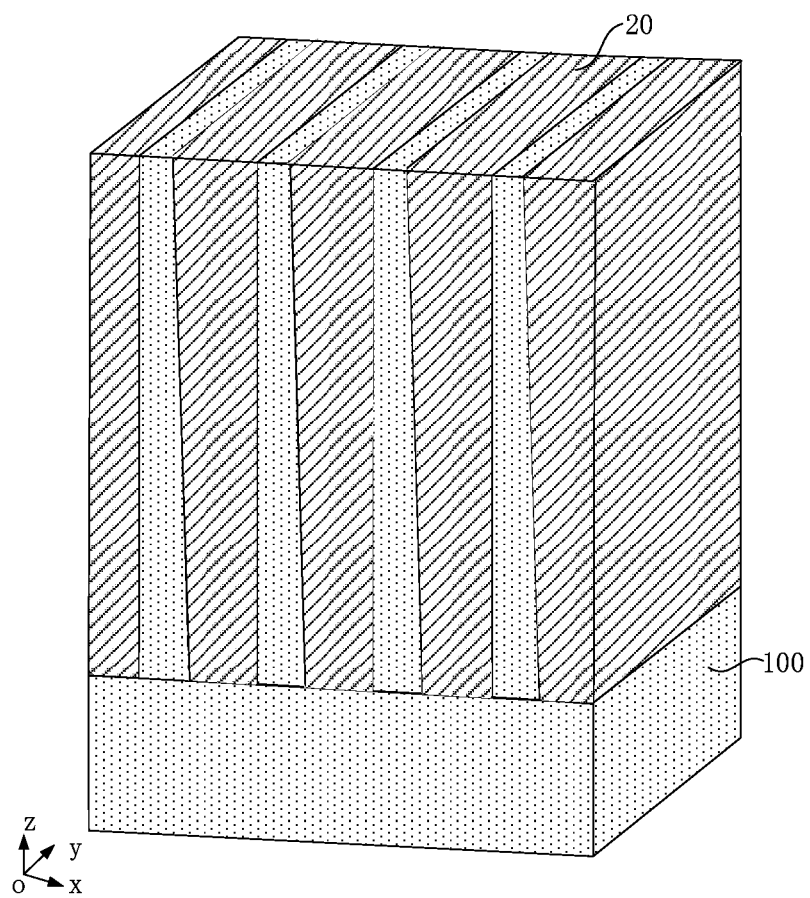

Referring to FIG. 2 to FIG. 4, a first patterned mask layer 101 is formed on the substrate 100, wherein parts of the first patterned mask layer 101 are arranged at intervals along the first direction ox and extend along the second direction oy. The substrate 100 is etched by using the first patterned mask layer 101 as a mask, to form a plurality of first trenches 102 in the substrate 100. Then, the first patterned mask layer 101 is removed and a deposition process is performed, to form an isolation material that covers a top surface of the substrate 100 and fills up the first trenches 102. A chemical mechanical planarization process is performed on the isolation material to expose the top surface of the substrate 100, such that the first trenches 102 are filled with the first isolation layer 20. The isolation material is not particularly limited, and may be, for example, silicon oxide or silicon nitride.

Figure 5:
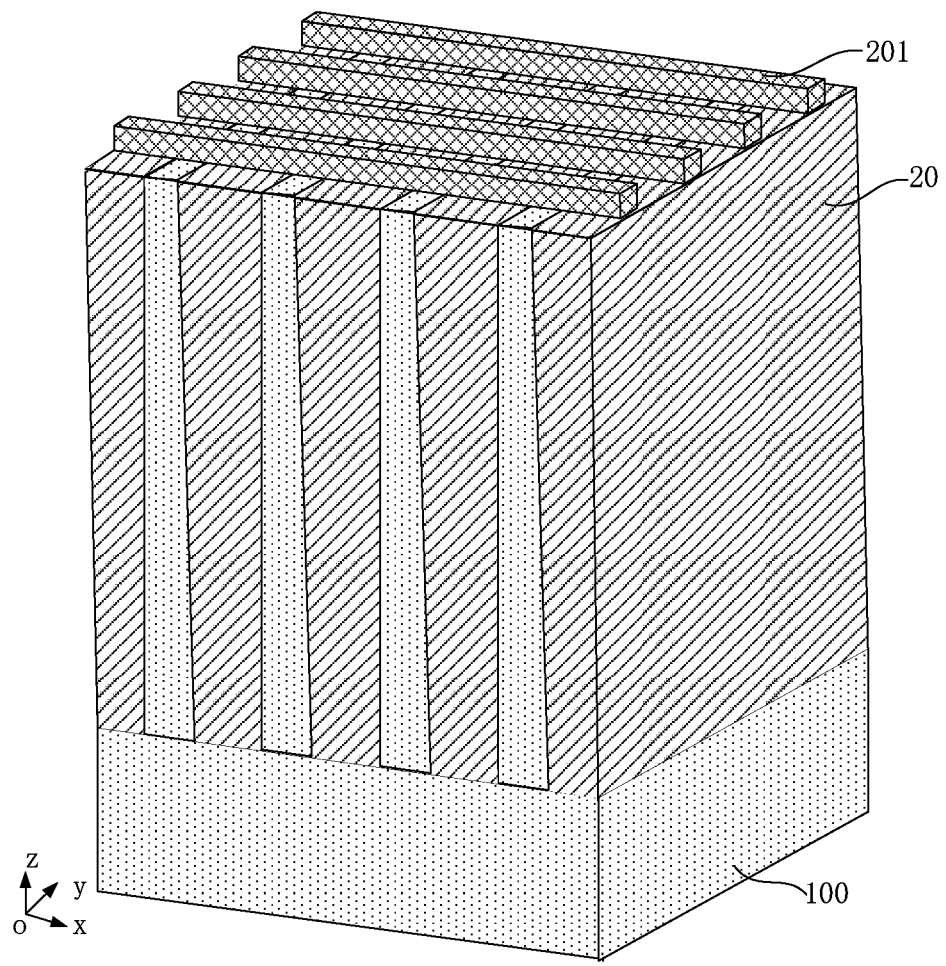
Figure 6:
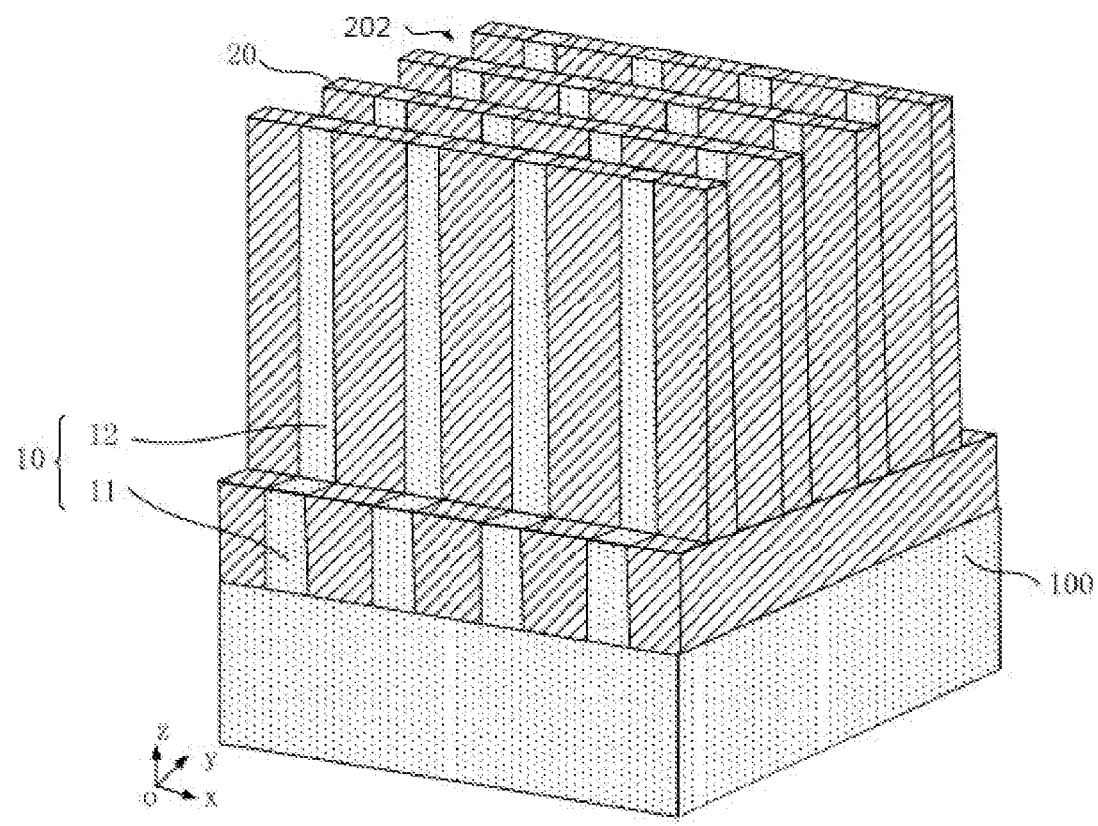
Figure 7:
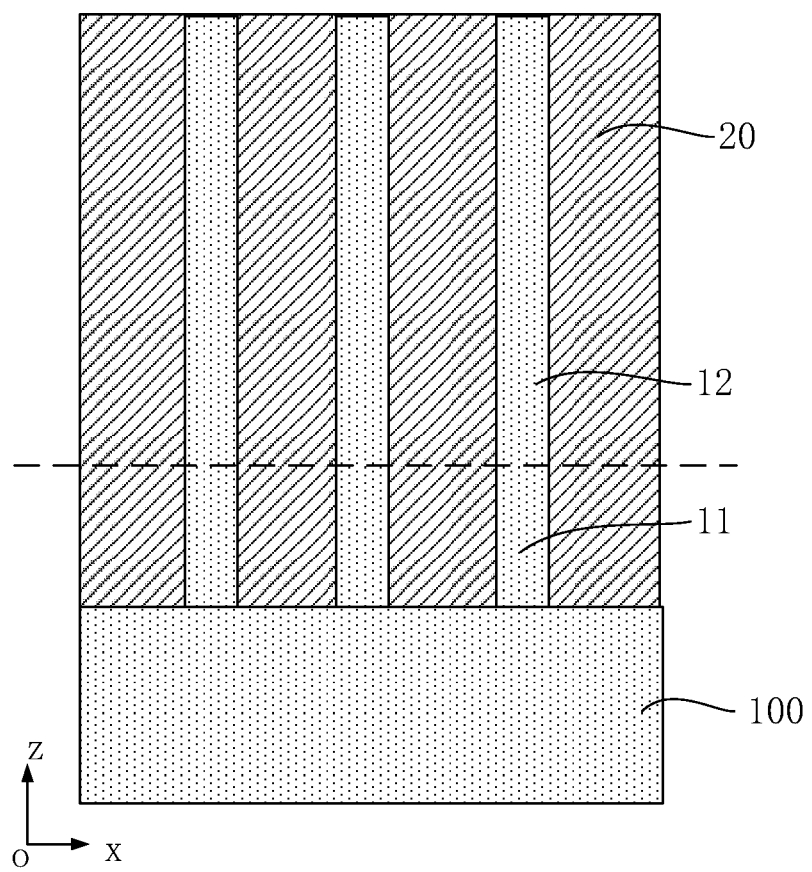

Referring to FIG. 5 and FIG. 6, a second patterned mask layer 201 is formed on a surface jointly formed by the substrate 100 and the first isolation layer 20. Parts of the second patterned mask layer 201 are arranged at intervals along the second direction oy different from the first direction ox, and extend along the first direction ox. The substrate 100 and the first isolation layer 20 are etched by using the second patterned mask layer 201 to form a plurality of second trenches 202, wherein an etching depth of the second trench 202 is less than an etching depth of the first trench 102. The second patterned mask layer 201 is removed, to form a plurality of body structures 10 arranged at intervals in the first direction ox on the substrate 100. Each body structure 10 includes a body layer 11 and a plurality of discrete body pillars 12 on the body layer 11. The plurality of body pillars 12 are arranged at intervals along the second direction oy and spaced apart by the plurality of second trenches 202.

Further referring to FIG. 6, the region of the body layer 11 is used for forming a bit line 30 subsequently. In the embodiments of the present disclosure, the bit line 30 has low resistance, and the manufactured semiconductor structure has desirable performance. A component device of the body pillar 12 may be a junctionless transistor. The body pillar 12 includes a source, a vertical channel, and a drain that are arranged in sequence. The source, the vertical channel, and the drain are doped with ions of a same type. On one hand, controllability of the gate of the transistor can be ensured, to improve the integration density and electrical performance of the semiconductor structure. On the other hand, impact caused by the growth of the bit line 30 can be minimized, thereby avoiding finally affecting the performance of the semiconductor structure.

Further referring to FIG. 6, in some embodiments of the present disclosure, the first direction ox intersects with the second direction oy. An angle between the first direction ox and the second direction oy is greater than 0° and less than or equal to 90°. For example, the angle is 1°, 2°, 10°, 30°, 50°, 70° or 90°. Optionally, the first direction ox and the second direction oy are perpendicular to each other.

Referring to FIG. 3 and FIG. 6 to FIG. 8 again, in some embodiments of the present disclosure, the first trenches 102 each located between adjacent ones of the plurality of body structures 10 extend along the second direction oy and are arranged at intervals along the first direction ox, and can separate the plurality of bit lines 30 from each other to form bit line trenches. The second trenches 202 each located between adjacent ones of the plurality of body pillars 12 extend along the first direction ox and are arranged at intervals along the second direction oy, and can separate the plurality of word lines 50 from each other. The etching depth of the second trench 202 is less than the etching depth of the first trench 102. For example, the etching depth of the first trench 102 is 2000 Angstrom to 4000 Angstrom, such as 2000 Angstrom, 3000 Angstrom, or 4000 Angstrom. When the second trench 202 is excessively deep, space for forming the bit line 30 subsequently is insufficient, and forming of the openings 11a in the body layer 11 is also affected, making it difficult to manufacture the bit line 30. When the second trench 202 is excessively shallow, the height of the body pillar 12 is reduced, which also results in insufficient space for forming the word line 50 and the VGAA transistor. Therefore, the depth of the second trench 202 is, for example, 1000 Angstrom to 2000 Angstrom, such as 1000

Angstrom, 1500 Angstrom, or 2000 Angstrom. In the embodiments of the present disclosure, the depth of the second trench 202 is less than the depth of the first trench 102, to ensure that the plurality of body layers 11 are arranged at intervals in parallel along the first direction ox, thereby ensuring the plurality of bit lines 30 subsequently formed and each being in the corresponding body layer 11 are independent of each other, thus avoiding unexpected situations such as electric leakage.

Figure 8:
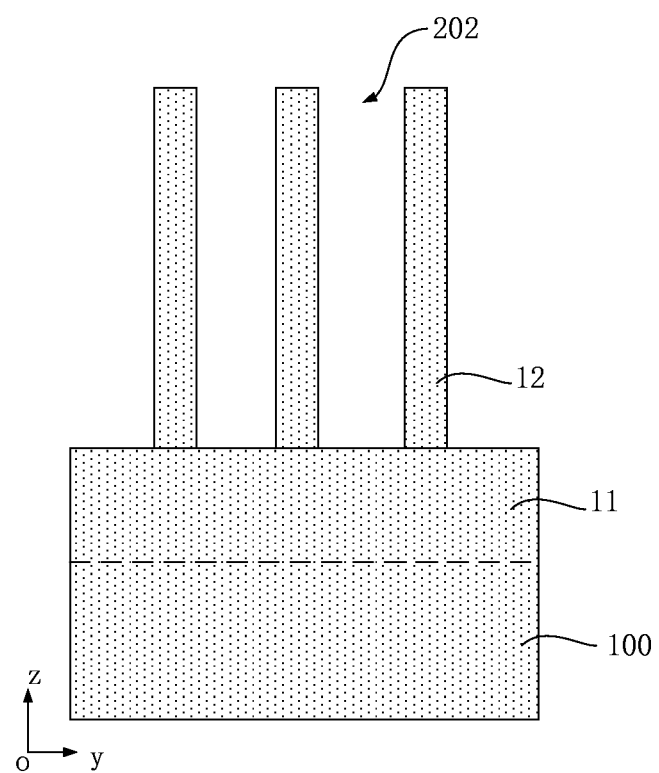
Figure 10:
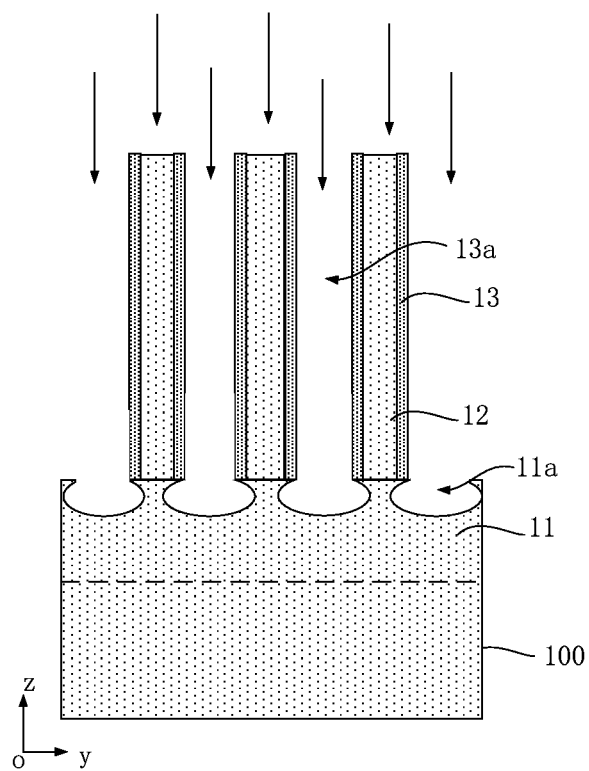

Referring to FIG. 7, FIG. 8, and FIG. 10, in step S12, the part of the body layer 11 located between adjacent body pillars 12 is etched, to form a plurality of openings 11a in the body layer 11. In some embodiments, the opening 11a is, for example, an arc-shaped opening. Orthographic projection of the arc-shaped opening 11a on an upper surface of the substrate 100 partially overlaps with orthographic projections of two body pillars 12, that are adjacent to the arc-shaped opening 11a, on the upper surface of the substrate 100. That is, the plurality of openings 11a are arranged at intervals along the second direction oy in the body layer 11. Adjacent openings 11a are close to but not in contact with each other under the body pillar 12. A maximum opening distance of the arc-shaped opening 11a in the body layer 11 is 8.5 nm to 11.5 nm, for example, 8 nm, 9 nm or 10 nm, which not only ensures the stability of the body pillar 12 located above, but also helps the metal silicide to grow from the opening 11a to both sides sufficiently during subsequent metal silicide processing in the body layer 11 through the openings 11a, so as to form the metal silicide that is continuous in the second direction oy to serve as the bit line 30. Certainly, in other embodiments of the present disclosure, the opening 11a may also be in other shapes, e.g., strip-shaped or polygon-shaped. It should be noted that, in the embodiments of the present disclosure, the opening 11a is first formed in the part of the body layer 11 between adjacent body pillars 12, which is adaptable to the case where the spacing between the body pillars 12 is insufficient while the bit line 30 needs to be grown through the spacing between the body pillars 12. In this way, the bit line 30 is continuous in the second direction oy.

Figure 9:
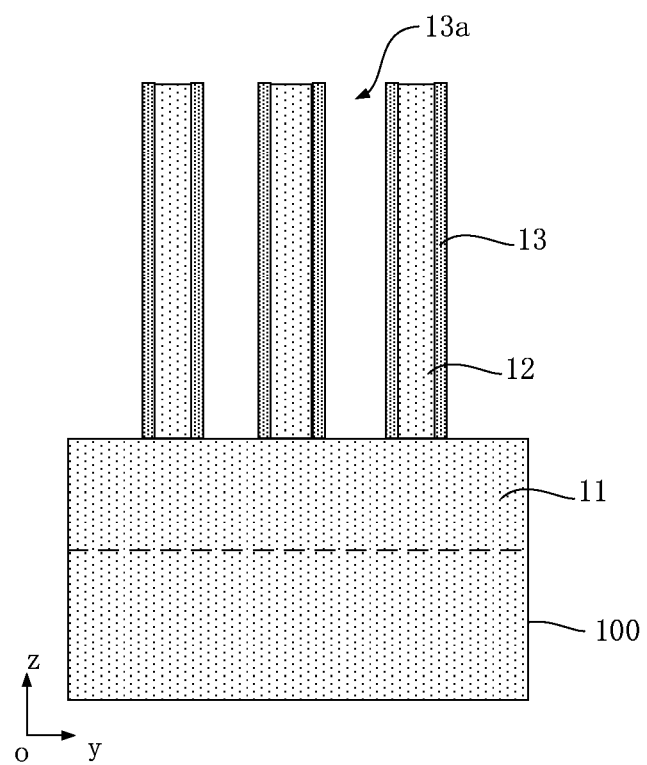
Figure 12:
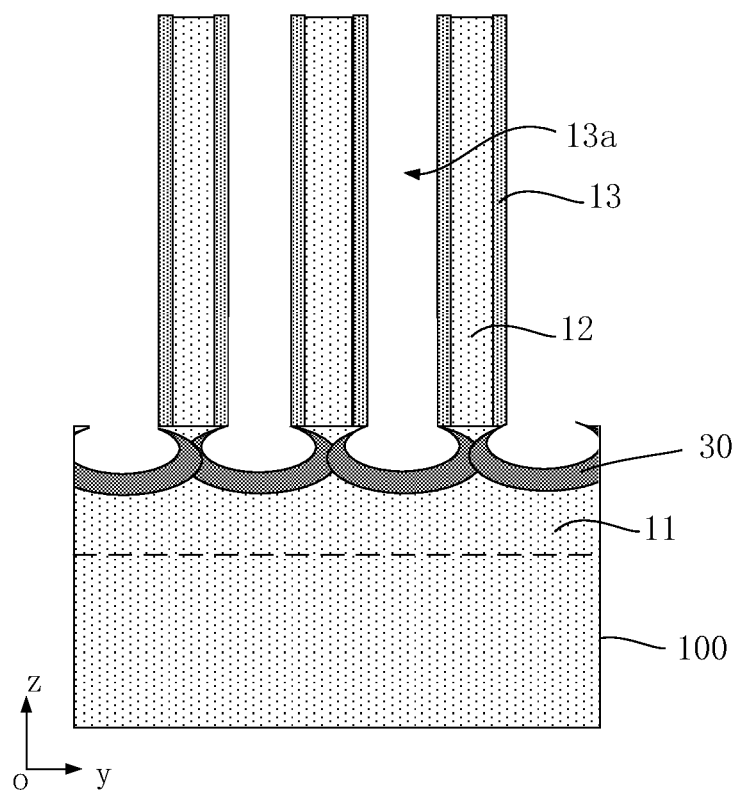

Referring to FIG. 9, FIG. 10, and FIG. 12, in some embodiments of the present disclosure, the bit lines 30 may be formed before the transistors 40 and word lines 50 are formed. In order to project channel sidewalls of the body pillars 12 for subsequently manufacturing the transistors 40, sidewalls of the body pillars 12 may be projected.

Referring to FIG. 9, a protective layer 13 is formed on the sidewalls of the body pillars 12, and gaps 13a exist between parts of the protective layer 13 of adjacent body pillars 12. When the plurality of body pillars 12 are separated from each other by the plurality of second trenches 202, a protective layer material may be deposited on surfaces of the plurality of second trenches 202. The protective layer material covers sidewalls and bottoms of the second trenches 202 as well as top surfaces of the body pillars 12. Then, a part of the protective layer at the bottoms of the second trenches 202 and on the top surfaces of the body pillars 12 is removed through, for example, an etching process, so as to form a protective layer 13 on the sidewalls of the body pillars 12. Gaps 13a exist between parts of the protective layer 13 of adjacent body pillars 12 to expose the part of the body layer 11 between the adjacent body pillars 12 and the top surfaces of the body pillars 12. In some embodiments of the present disclosure, the protective layer 13 may be made of, for example, an insulating material such as silicon oxide, silicon nitride, or silicon oxynitride.

Referring to FIG. 10, an etching process, such as isotropic etching, may be performed on the body layer 11 along the gaps 13a, to form the plurality of openings 11a arranged at intervals along the second direction oy in the body layer 11. The isotropic etching has no obvious directional selectivity, such that the arc-shaped openings 11a can be formed in the body layer 11. Adjacent openings 11a are close to but not in contact with each other under the body pillar 12, which not only ensures the stability of the body pillar 12 located above, but also facilitates growth of a continuous metal silicide in the body layer 11 through the openings 11a. In some embodiments, for example, a reactive etching gas, such as $Cl_2$, may be used in plasma etching to improve the etching speed and etching profile.

In other embodiments of the present disclosure, after the openings 11a are formed, the openings 11a may be cleaned by using any one or any combination of SC1 solution, SC2 solution, SC3 solution, hydrofluoric acid or dry $CF_4$ gas, to improve cleanliness in the openings 11a, thereby improving the conductivity of the bit line 30 subsequently formed by annealing the conductive material layer deposited on the surfaces of the openings 11a.

Referring to FIG. 12, in step S40, in some embodiments, the body layer 11 is siliconized through the plurality of openings 11a to form a metal silicide that is continuous along the second direction oy, so as to form a plurality of bit lines 30, each bit line 30 is in a corresponding body layer 11.

Further referring to FIG. 12, a conductive material is deposited on the surfaces of the plurality of openings 11a, and an annealing process is performed to form the bit line 30. The conductive material is deposited, by using a chemical vapor deposition (CVD) process for example, into the openings 11a along the spacing between the body pillars 12, for example, along the gaps 13a. Then, annealing is performed, such that the conductive material is siliconized by the silicon material of the body layer 11 to form a metal silicide. Afterwards, the unreacted metal silicide may further be removed. The openings 11a can increase a reaction area between the conductive material and silicon, such that the grown metal silicide is continuous along the second direction oy in the body layer 11 to form the bit line 30. In some embodiments, the conductive material may be a metal material such as Co, Ni, Ti, W, Cu, or Al.

Figure 11:
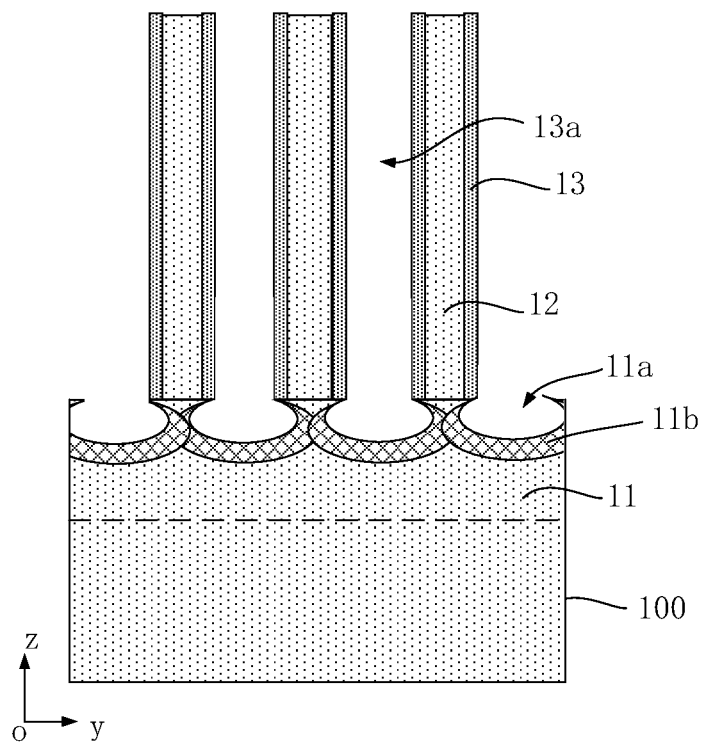

Referring to FIG. 11 and FIG. 12, in other embodiments of the present disclosure, to reduce the Schottky contact resistance between the bit line 30 and the substrate 100 as well as the body structure 10, that is, the Schottky contact resistance at the interface between the metal silicide and the silicon, the following may be performed before step S13: performing an ion implant on the body layer 11 along the plurality of openings 11a with a preset energy and a preset dosage to form a doped region 11b, and performing an annealing process; then siliconizing the body layer having the doped region 11b to form the bit line 30.

Further referring to FIG. 11, in some specific embodiments, for example, ion implant may be implemented through ion implantation using P-type ions, such as B ions. Definitely, in other embodiments, N-type ions that have a higher current may be used. Specifically, for example, As ions or P ions may be used. The preset energy for ion implantation may be, for example, 1 keV to 20 keV; and/or the preset dosage is $1e^{15}$ $cm^{-2}$ to $1e^{18}$ $cm^{-2}$. For example, the preset energy is 1 keV, 1.5 keV, 5 keV, 10 keV or 12 keV; the preset dosage is $1e^{15}$ $cm^{-2}$, $5e^{15}$ $cm^{-2}$, $1e^{16}$ $cm^{-2}$, $1e^{17}$ $cm^{-2}$ or $1e^{18}$ $cm^{-2}$. In the embodiments of the present disclosure, at least one ion implantation operation within the foregoing range, e.g., one low-energy high-dosage ion implantation operation, is performed on the openings 11a at the bottoms of the gaps between adjacent body pillars 12 and on the tops of the body pillars 12, such that impurities are accumulated at the interface between the silicide and silicon due to the segregation effect in the process of forming the metal silicide, thereby reducing the Schottky contact resistance and improving the performance of the semiconductor structure. In other embodiments of the present disclosure, the protective layer 13 provides little projection effect for the sidewalls of the body pillars 12. In addition, to further reduce the impact on the body pillar 12, the subsequently formed transistor 40 surrounding the body pillar 12 may be a junctionless transistor (e.g., referring to FIG. 13), such that after the body pillar 12 serving as the vertical channel is doped with a certain dosage of ions, the body pillar 12 itself is highly doped, for example, the dosage is $1e^{18}$ cm$^{-3}$ to $1e^{20}$ cm$^{-3}$. Therefore, the ion implantation in the embodiments of the present disclosure has little impact on the subsequently manufactured transistor 40.

Figure 13:
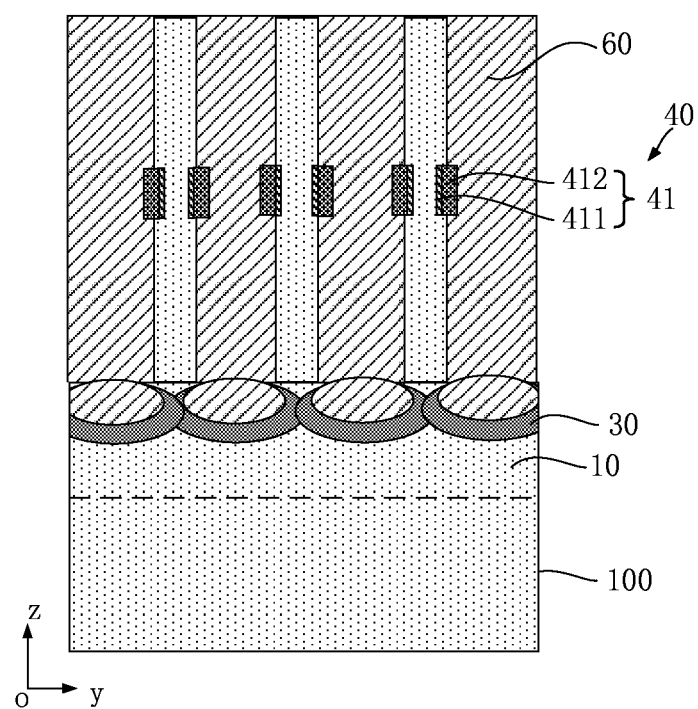
Figure 14:
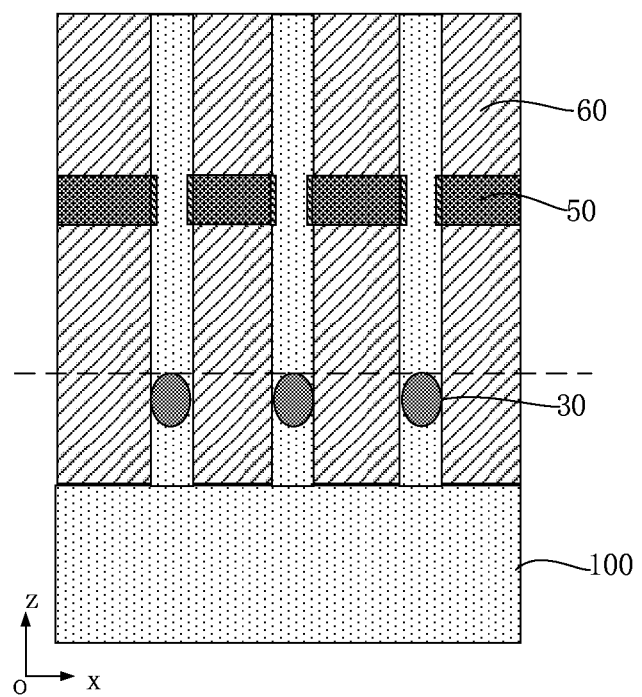

Referring to FIG. 13 and FIG. 14, in some embodiments of the present disclosure, after the plurality of bit lines 30 each being in the corresponding body layer 11 are formed, semiconductor devices may further be manufactured on the substrate 100 and the body structure 10 subsequently.

Referring to FIG. 13 and FIG. 14, the plurality of body pillars 12 on the body structure 10 are used as active regions to form a plurality of corresponding VGAA transistors 40. A gate 41 of the VGAA transistor 40 surrounds the body pillar 12. The plurality of body pillars 12 are arranged at intervals along the second direction oy and are spaced apart from each other by the plurality of second trenches 202. In the embodiments of the present disclosure, for example, the VGAA transistor 40 may be a junctionless transistor, which can not only improve the performance of the semiconductor structure to ensure the control capability of the gate 41, but also avoid impact on the VGAA transistor 40 during forming of the bit line 30. Specifically, for example, the body pillar 12 is formed into a source (not shown in the figure), a vertical channel, and a drain (not shown in the figure) that are sequentially arranged by doping the body pillar 12 with ions of a same type. One of the source of the VGAA transistor or the drain of the VGAA transistor 40 is connected to the bit line 30, and the other is connected to a capacitor (not shown in the figure). The doping process of the body pillar 12 may be performed simultaneously with, or performed before or after the ion implantation process, which is not particularly limited and may be selected according to actual process requirements.

Further referring to FIG. 13 and FIG. 14, a conductive material is deposited in the second trenches 202 to manufacture the gates 41 and the word lines 50. In some embodiments, for example, the protective layer 13 on the sidewalls of the body pillars 12 and the first isolation layer 20 may be removed, and the second trenches 202 are filled with the conductive material. A gate dielectric layer 411 may be formed before the conductive material is formed. For example, the surfaces of the body pillars 12 may be oxidized to form the gate dielectric layer 411, where the gate dielectric layer 411 surrounds the body pillars 12. Then, the conductive material is deposited, and the conductive material is planarized and etched back to form the word lines 50. The conductive material around the gate dielectric layer 411 forms a gate conductive layer 412, where the gate dielectric layer 411 and the gate conductive layer 412 constitute the gates 41 of the transistors 40. Each word line 50 connects the gates 41 of the VGAA transistors 40 and extends continuously along the first direction ox; the word lines 50 are arranged at intervals in the second direction oy. The conductive material may be, for example, a low-resistance metal material or metal oxide, such as W or a compound thereof.

Further referring to FIG. 13 and FIG. 14, a capacitor (not shown in the figure) may further be formed on the surface of the VGAA transistor 40. Specifically, the capacitor is located on the top surface of the body pillar 12 and is connected to one of the source of the transistor 40 or the drain of the transistor 40, and the other of the source of the transistor 40 or the drain of the transistor 40 is connected to the bit line 30. After that, the remaining gaps may be filled with a second isolation layer 60, to electrically isolate the devices formed on the substrate 100 from each other. The second isolation layer 60 may be made of, for example, silicon oxide, silicon nitride, or silicon oxynitride.

In the embodiments of the present disclosure, a plurality of body structures 10 are formed on a substrate, wherein each body structure 10 includes a body layer 11 and a plurality of discrete body pillars 12 located on the body layer 11; the part of the body layer 11 located between adjacent body pillars 12 is etched to form a plurality of openings 11a in the body layer 11, so as to form a continuous metal silicide in the body layer 11 to serve as a bit line 30, thereby reducing the resistance of the semiconductor structure and improving the performance of the semiconductor structure. In addition, in the embodiments of the present disclosure, the body layer 11 are further doped with ions through the plurality of openings 11a, to reduce contact resistance between silicon in the body pillars 12 or body layer 11 and the metal silicide in the process of forming the metal silicide in the body layer 11. The embodiments of the present disclosure further illustrate a semiconductor structure in which VGAA transistors 40, word lines 50, capacitors and an isolation structure are manufactured after the buried bit lines 30 are formed. The semiconductor structure provided by the embodiments of the present disclosure effectively reduces the size of the memory and improves the level of integration and performance of the memory.

As shown in FIG. 15 to FIG. 23, in other embodiments of the present disclosure, to adapt to the versatility and flexibility of the manufacturing process, it is also possible to form the bit lines 30 after forming of the VGAA transistors 40 and the word lines 50.

Figure 16:
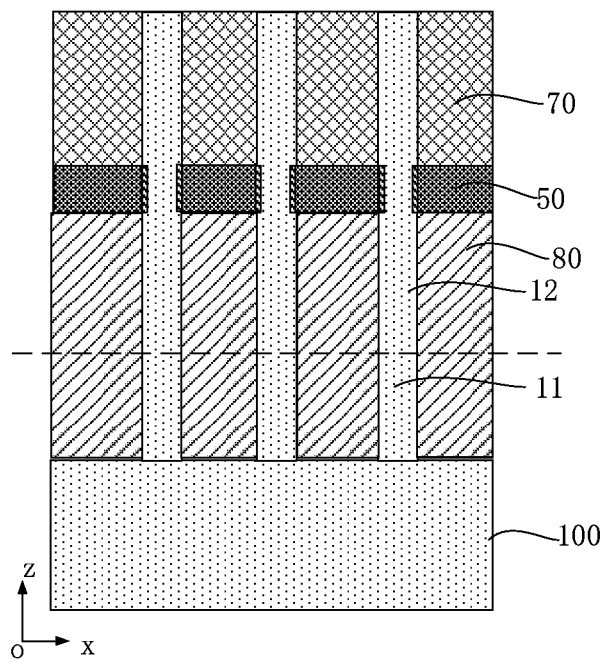
FIG. 16 to FIG. 23 are schematic structural diagrams corresponding to a method of manufacturing a semiconductor structure according to another embodiment of the present disclosure, wherein direction ox is a first direction, direction oy is a second direction, and direction oz is a height/thickness direction.
Figure 22:
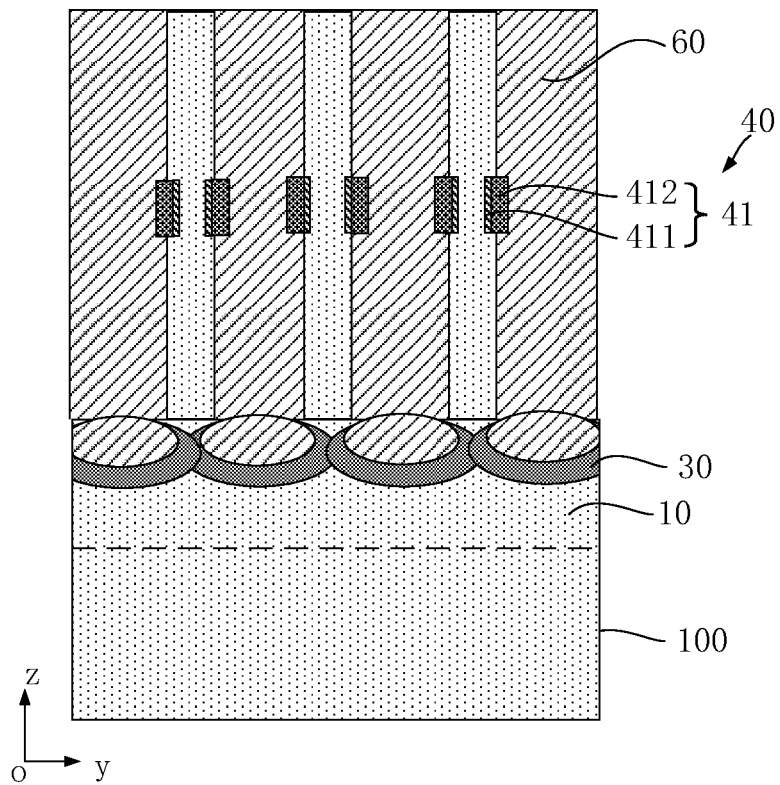
Figure 23:
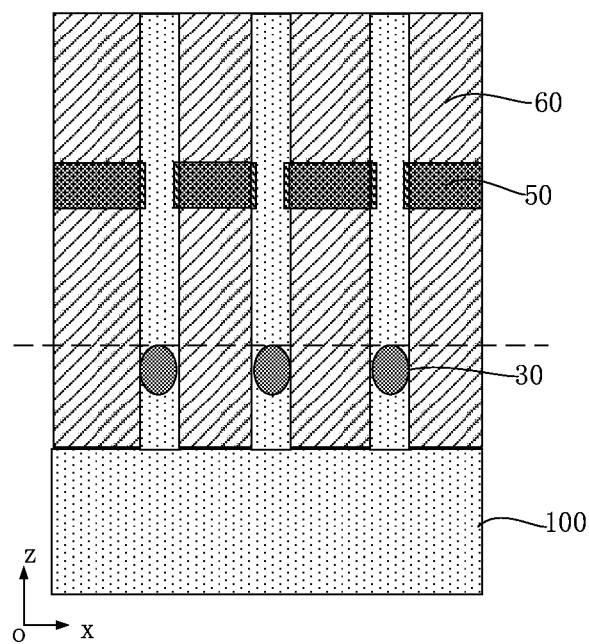

It should be noted that, FIG. 16 and FIG. 23 are partial cross-sectional views taken along a first direction ox; and FIG. 17 to FIG. 22 are partial cross-sectional views taken along a second direction oy.

Figure 15:
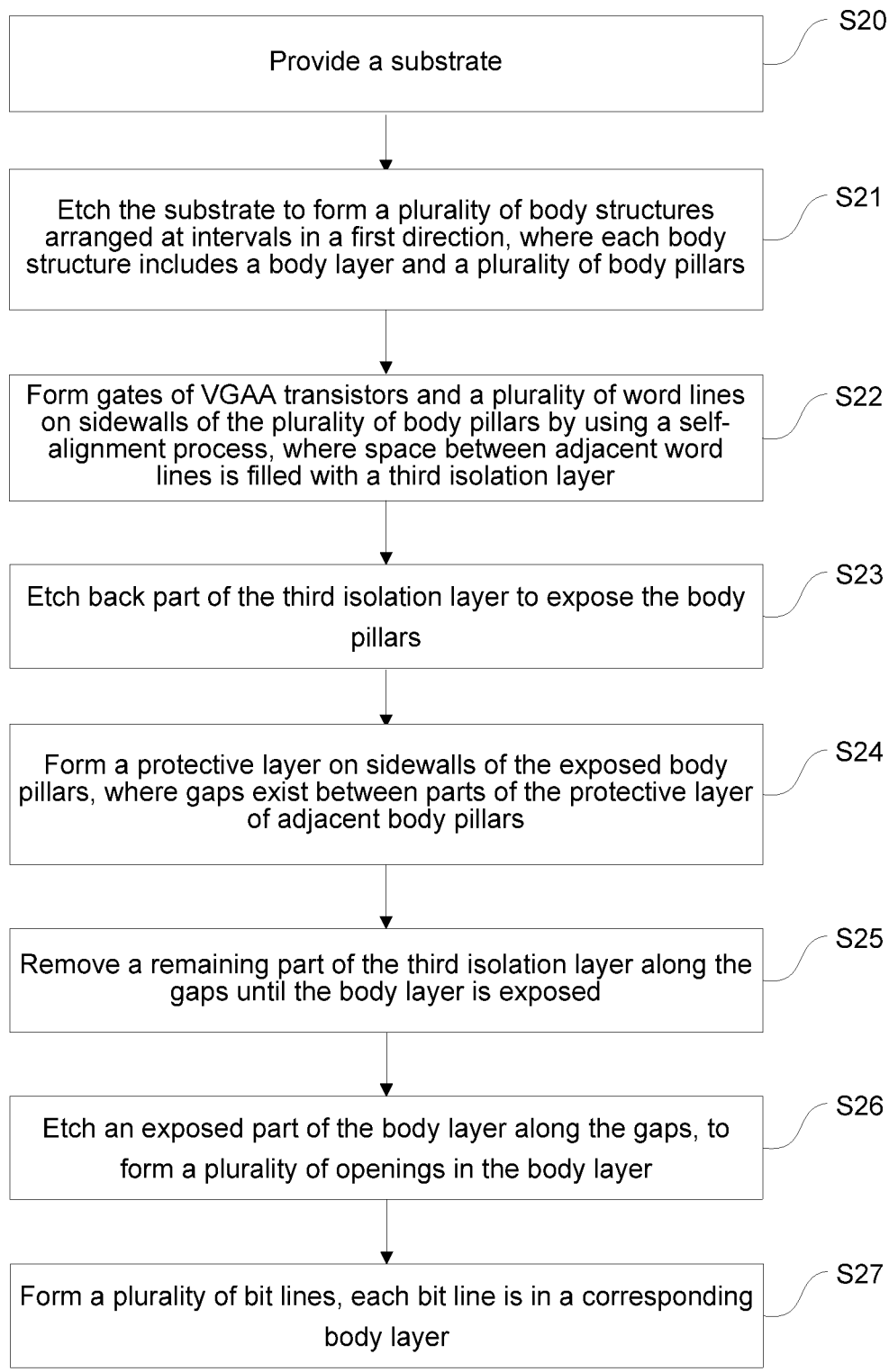
FIG. 15 is a flowchart of a method of manufacturing a semiconductor structure according to another embodiment of the present disclosure.

Referring to FIG. 15, an embodiment of the present disclosure provides a method of manufacturing a semiconductor structure, including:

S20: Provide a substrate 100.

S21: Etch the substrate 100 to form a plurality of body structures 10 arranged at intervals in a first direction ox, wherein a space between adjacent body structures 10 is filled with a first isolation layer 20, each body structure 10 includes a body layer 11 and a plurality of discrete body pillars 12 located on the body layer 11, the plurality of body pillars 12 are arranged at intervals along a second direction oy, and the first direction ox is different from the second direction oy.

S22: Form gates 41 of a plurality of VGAA transistors 40 and a plurality of word lines 50 on sidewalls of the plurality of body pillars 12 by using a self-aligned process, wherein space between adjacent word lines 50 is filled with a third isolation layer 70.

S23: Etch back part of the third isolation layer 70 to expose the body pillars 12.

S24: Form a protective layer 13 on sidewalls of the exposed body pillars 12, wherein gaps 13a exist between parts of the protective layer 13 of adjacent body pillars.

S25: Remove a remaining part of the third isolation layer 70 along the gaps 13a until the body layer 11 is exposed.

S26: Etch an exposed part of the body layer 11 along the gaps 13a, to form a plurality of openings 11a in the body layer 11.

S27: Siliconize the body layer 11 through the plurality of openings 11a to form a metal silicide that is continuous along the second direction oy, so as to form a plurality of bit lines 30, each bit line 30 is in the corresponding body layer 11.

Specifically, referring to FIG. 15 and FIG. 2 to FIG. 8, in some embodiments of the present disclosure, steps S20 and S21 may be the same as steps S10 and S11, and are not described in detail again herein.

Figure 17:
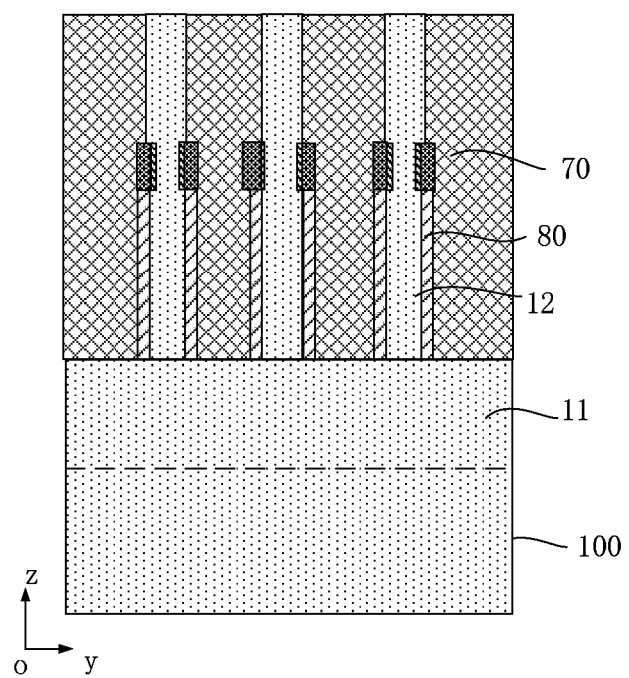

Further referring to FIG. 16 and FIG. 17, in step S22, gates 41 of the VGAA transistors 40 and the word lines 50 that connect the gates 41 are formed on the sidewalls of the plurality of body pillars 12 by using a self-aligned process. The gate 41 surrounds the body pillar 12. The body pillar 12 is formed into a source, a drain and a vertical channel of the VGAA transistor 40. The gate 41 surrounds the vertical channel, and includes a part of a gate dielectric layer 411 and a part of a gate conductive layer 412 that surrounds the channel in sequence from the inner side to the outer side. Each word line 50 connects the gates 41 and extends along the first direction ox. The word lines 50 are arranged at intervals along the second direction oy. Space between adjacent word lines 50 is filled with a third isolation layer 70. Parts of the third isolation layer 70 extend along the first direction ox and are arranged at intervals along the second direction oy. In some embodiments, the third isolation layer 70 is made of, for example, silicon nitride. The VGAA transistor 40 provided by the embodiments of the present disclosure has a small size. More transistor devices can be formed per unit area, to improve the level of integration of the semiconductor structure, such that the semiconductor structure is adapted to the miniaturization, light weight, and energy saving requirements of end customers.

Figure 18:
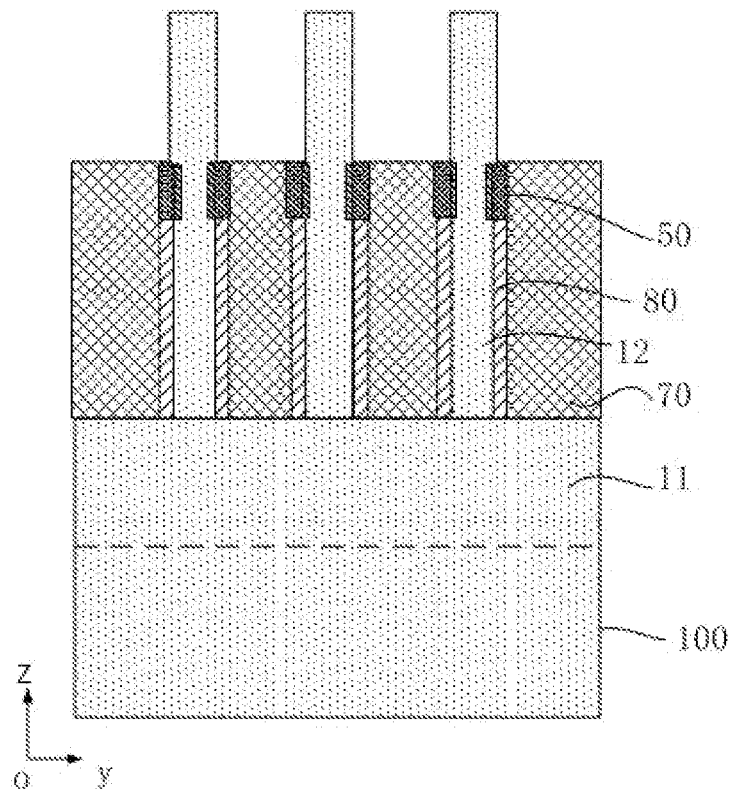

Referring to FIG. 18, in step S23, the third isolation layer 70 is partially removed to reach a top surface of the gate 41, so as to expose a part of the body pillar 12 at the source or drain in the upper part of the VGAA transistor 40, and a top surface of the remaining part of the third isolation layer 70 is lower than the top surface of the gate 41.

Figure 19:
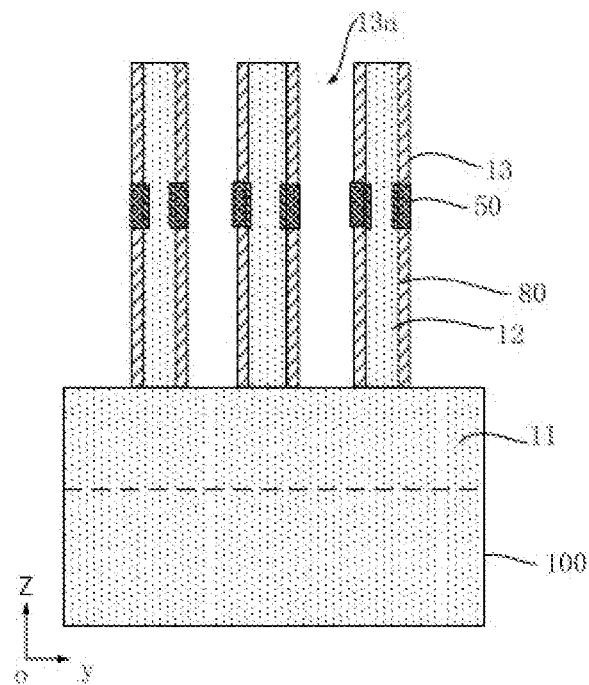

Referring to FIG. 19, in step S24, the protective layer 13 is formed on the sidewalls of the exposed body pillars 12. In some embodiments, for example, after an oxide is deposited on the surfaces of the exposed body pillars 12 to project the silicon sidewalls of the sources/drains on the body pillars 12, the oxide on the top surfaces of the body pillars 12 and the top surface of the third isolation layer 70 may be removed through dry etching. In this case, the surfaces of the body pillars 12 are protected by the protective layer 13 and a fourth isolation layer 80 that is reserved on the body pillars 12 in the self-aligned process. The gaps 13a exist between parts of the protective layer 13 of adjacent body pillars 12. For example, the material of the protective layer 13 may be same as the material of the fourth isolation layer 80, and may be, for example, silicon oxide.

Further referring to FIG. 19, in step S24, the remaining part of the third isolation layer 70 is removed along the gaps 13a, until the body layer 11 is exposed. In some embodiments of the present disclosure, in order to remove the remaining part of the isolation layer 70 completely, the material of the remaining part of the isolation layer 70 may be removed along the gaps 13a by using a wet etching process, to expose the part of the body layer 11 between adjacent body pillars 12. The remaining part of the isolation layer 70 may be partially removed by using a wet etching process. The concentration, flow or etching time of an etching solution may be adjusted. The etching solution, for example, includes but is not limited to, a single solution of or a mixture of more than one of the following solutions: phosphoric acid, diluted hydrofluoric acid, diluted sulfuric acid, carbon tetrafluoride ($CF_4$), or sulfur hexafluoride ($SF_6$).

Figure 20:
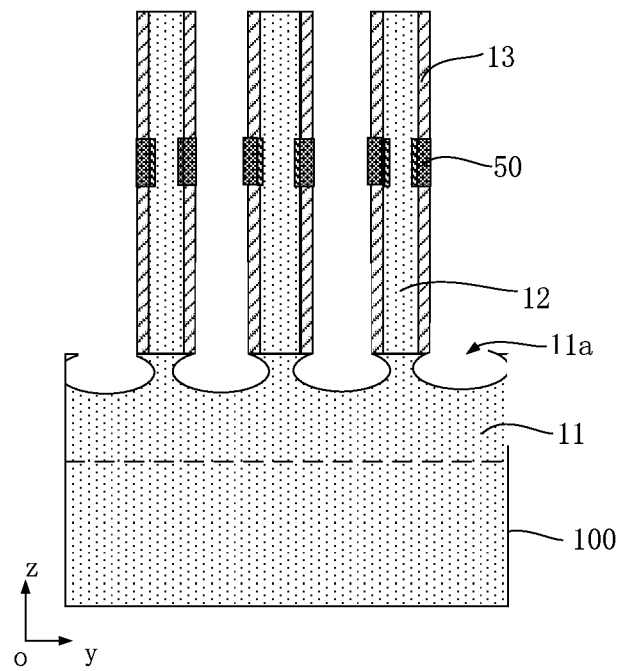
Figure 21:
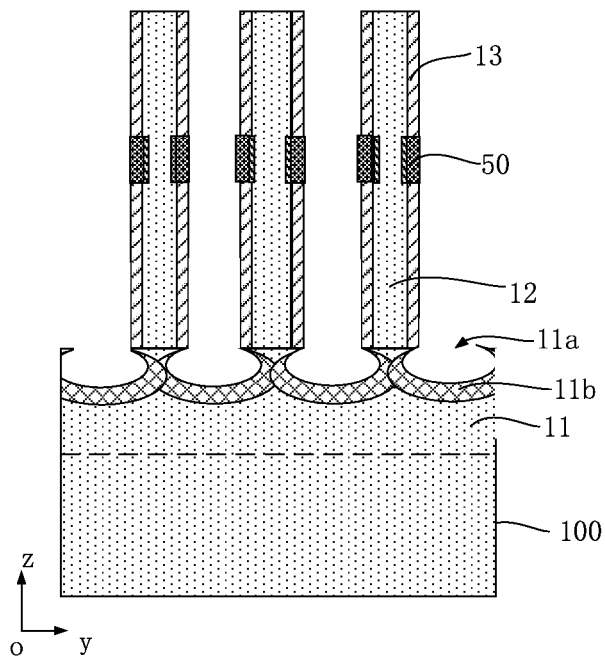

Referring to FIG. 20, in step S25, the exposed part of the body layer 11 is etched along the gaps 13a, to form a plurality of openings 11a in the body layer 11. In some embodiments, the process of etching the exposed part of the body layer 11 may be the forming process described above, but is not limited thereto. Definitely, the etching process may be implemented in any possible manner. Any method that can form the expected openings 11a in the body layer 11 shall fall within the protection scope of the present disclosure.

Further referring to FIG. 22 and FIG. 23, step S26 is then performed: a conductive material is deposited in the openings 11a along the gaps 13a, and an annealing process is performed, such that the conductive material reacts with the silicon material of the body layer 11, so as to form a metal silicide that is continuous in the body layer 11 to serve as the bit line 30. Further, in some embodiments, referring to FIG. 21, before the bit line 30 is formed, in order to reduce the Schottky resistance at the interface between the metal silicide and silicon, low-energy high-dosage ion implant may be performed on the body layer 11 along the gaps 13a by using the openings 11a. For example, ion implant may be implemented through ion implantation using P-type ions, such as B ions. Definitely, in other embodiments, N-type ions that have a higher current may be used. Specifically, for example, As ions or P ions may be used. The preset energy for ion implantation may be, for example, 1 keV to 20 keV; and/or the preset dosage is $1e^{15}$ $cm^{-2}$ to $1e^{18}$ $cm^{-2}$. For example, the preset energy is 1 keV, 1.5 keV, 5 keV, 10 keV or 12 keV; the preset dosage is $1e^{15}$ $cm^{-2}$, $5e^{15}$ $cm^{-2}$, $1e^{16}$ $cm^{-2}$, $1e^{17}$ $cm^{-2}$ or $1e^{18}$ $cm^{-2}$. Further, during the ion implantation process, the source/drain of the body pillar 12 may be doped at the same time, to reduce steps of the manufacturing process. Definitely, doping may alternatively be performed before or after the ion implantation process, which may be adjusted according to actual needs.

In this case, in the embodiments of the present disclosure, the VGAA transistors 40 and the word lines 50 are formed before the bit lines 30 are formed, which is adaptable to the versatility of the manufacturing process. Then, the protective layer 13, the fourth isolation layer 80 and the like in the foregoing process can further be removed, and a capacitor (not shown in the figure) may be formed on the surface of the VGAA transistor 40. Specifically, the capacitor is located on the top surface of the body pillar 12 and is connected to one of the source of the transistor 40 or the drain of the transistor 40, and the other of the source of the transistor 40 or the drain of the transistor 40 is connected to the bit line 30. After that, the remaining gaps are filled with a second isolation layer 60, to electrically isolate the devices formed on the substrate 100 from each other.

Referring to FIG. 1 to FIG. 23, an embodiment of the present disclosure provides a semiconductor structure, including a substrate 100, body structures 10, a first isolation layer 20, and bit lines 30. The body structures 10 are arranged at intervals along a first direction ox, and space between adjacent body structures 10 is filled with the first isolation layer 20. Each body structure 10 includes a body layer 11 and a plurality of discrete body pillars 12 located on the body layer 11. The plurality of body pillars 12 are arranged at intervals along a second direction oy, wherein a part of the body layer 11 between adjacent body pillars 12 is provided with openings 11a. The bit lines 30 each include a metal silicide that is continuous along the second direction oy in a corresponding body layer 11 through the openings 11a.

In further embodiments of the present disclosure, the semiconductor structure further includes vertical transistors 40, word lines 50, capacitors (not shown in the figure), and an isolation structure that includes the first isolation layer 20 and the second isolation layer 60. The gate of the VGAA transistor 40 surrounds the sidewall of the body pillar 12, and the body pillar 12 is formed into a drain, a vertical channel, and a source of the VGAA transistor 40. The gate of the VGAA transistor 40 is connected to the word line 50. The word lines 50 extend along the first direction ox and are arranged at intervals in the second direction oy. One of the source of the VGAA transistor 40 or the drain of the VGAA transistor 40 is connected to the bit line 30, and the other is connected to the capacitor.

The semiconductor structure provided by the embodiments of the present disclosure may be formed by using the manufacturing method provided above, but is not limited thereto. In the semiconductor structure provided by the foregoing embodiment, a plurality of body structures are formed on a substrate, wherein each body structure includes a body layer and a plurality of discrete body pillars located on the body layer; the part of the body layer located between adjacent body pillars is etched to form a plurality of openings in the body layer, so as to facilitate lateral growth of the metal silicide in the substrate, such that the metal silicide at adjacent positions becomes continuous to form a line. In this way, a continuous metal silicide is formed in the body layer to serve as a bit line, thereby reducing the resistance of the semiconductor structure and improving the performance of the semiconductor structure. In addition, in the embodiments of the present disclosure, ions are implanted into the body layer through the plurality of openings, to reduce contact resistance between silicon and the metal silicide in the process of forming the metal silicide in the body layer.

It may be noted that the foregoing embodiments are merely for the purpose of description instead of limiting the present disclosure.

The embodiments of this specification are described in a progressive manner, and each embodiment focuses on differences from other embodiments. The same or similar parts between the embodiments may refer to each other.

The technical characteristics of the above embodiments can be employed in arbitrary combinations. To provide a concise description of these embodiments, all possible combinations of all the technical characteristics of the above embodiments may not be described; however, these combinations of the technical characteristics should be construed as falling within the scope defined by the specification as long as no contradiction occurs.

The above embodiments are only intended to illustrate several implementations of the present disclosure in detail, and they should not be construed as a limitation to the patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A method of manufacturing a semiconductor structure, comprising: providing a substrate;
   etching the substrate to form a plurality of body structures arranged at intervals in a first direction, wherein a space between adjacent body structures of the plurality of body structures is filled with a first isolation layer, each body structure of the plurality of body structures comprises a respective body layer and a respective plurality of body pillars that are discrete and are located on the respective body layer, the respective plurality of body pillars are arranged at intervals along a second direction, and the first direction is different from the second direction;
   in each body structure of the plurality of body structures, etching a part of the respective body layer between adjacent body pillars of the respective plurality of body pillars to form a plurality of discrete openings in the respective body layer; and
   in each body structure of the plurality of body structures, siliconizing the respective body layer through the respective plurality of discrete openings to form a metal silicide that is continuous in the second direction along the respective plurality of body pillars, so as to form a bit line being in the respective body layer.

2. The method of manufacturing according to claim 1, wherein each discrete opening of the plurality of discrete openings is an arc-shaped opening, and partially overlaps with two respective body pillars of the plurality of body pillars that are adjacent to the respective opening.

3. The method of manufacturing according to claim 2, wherein a maximum opening distance of the arc-shaped opening in the body layer is 8.5 nm to 11.5 nm.

4. The method of manufacturing according to claim 2, wherein the etching a part of the respective body layer between adjacent body pillars of the respective plurality of body pillars to form a plurality of discrete openings in the respective body layer comprises:
   forming a protective layer on sidewalls of the respective plurality of body pillars, wherein gaps exist between parts of the protective layer of the adjacent ones of the body pillars of the respective plurality of body pillars; and
   performing an isotropic etching on the respective body layer along the gaps to form the plurality of discrete openings in the respective body layer.

5. The method of manufacturing according to claim 4, wherein the isotropic etching is performed by using a reactive etching gas.

6. The method of manufacturing according to claim 1, wherein the siliconizing the respective body layer through the respective plurality of discrete openings to form a metal silicide that is continuous along the second direction comprises: depositing a conductive material on surfaces of the respective plurality of openings, and performing an annealing process to form the bit line.

7. The method of manufacturing according to claim 6, before the siliconizing the respective body layer through the respective plurality of discrete openings to form a metal silicide that is continuous along the second direction, the method further comprises: performing an ion implant on the respective body layer along the respective plurality of discrete openings with a preset energy and a preset dosage to form a doped region, and performing an annealing process; and siliconizing the respective body layer having the doped region.

8. The method of manufacturing according to claim 7, wherein at least one of:
the preset energy is 1 keV to 20 keV; or
the preset dosage is $1e^{15}$ cm$^{-2}$ to $1e^{18}$ cm$^{-2}$.

9. The method of manufacturing according to claim 1, wherein the etching the substrate to form a plurality of body structures comprises:
etching the substrate along the first direction and forming a plurality of first trenches, and filling the first trenches with the first isolation layer; and
etching the substrate and the first isolation layer along the second direction and forming a plurality of second trenches, wherein an etching depth of the second trench is less than an etching depth of the first trench to form the plurality of body structures arranged at intervals along the first direction on the substrate, wherein each body structure of the plurality of body structures comprises the respective body layer and the respective plurality of body pillars that are discrete and are located on the respective body layer, and the respective plurality of body pillars are arranged at the intervals along the second direction and spaced apart from each other by the plurality of second trenches.

10. The method of manufacturing according to claim 1, further comprising:
in each body structure of the plurality of body structures, forming a plurality of vertical gate-all-around transistors, wherein a gate of each vertical gate-all-around transistor of the plurality of vertical gate-all-around transistor surrounds a body pillar of the respective plurality of body pillars;
forming a plurality of word lines, wherein each word line of the plurality of word lines connects the gates of the plurality of vertical gate-all-around transistors of adjacent body structures of the plurality of body structures;
forming a plurality of capacitors, wherein each capacitor of the plurality of capacitors is connected to a source of a respective vertical gate-all-around transistor of the plurality of vertical gate-all-around transistors or a drain of the respective vertical gate-all-around transistor of the plurality of vertical gate-all-around transistors; and
filling gaps with a second isolation layer.

11. The method of manufacturing according to claim 10, wherein the source of the respective vertical gate-all-around transistor of the plurality of vertical gate-all-around transistors, the drain of the respective vertical gate-all-around transistor of the plurality of vertical gate-all-around transistors, and vertical channel of the respective vertical gate-all-around transistor of the plurality of vertical gate-all-around transistors are sequentially arranged by doping a respective body pillar of the respective plurality of body pillars with ions of a same type.

12. The method of manufacturing according to claim 1, after the etching the substrate to form a plurality of body structures, the method further comprises:
forming gates of a plurality of vertical gate-all-around transistors and a plurality of word lines on sidewalls of body pillars of the plurality of body pillars by using a self-aligned process, wherein a space between adjacent word lines of the plurality of word lines is filled with a third isolation layer;
etching back a part of the third isolation layer to expose portions of the body pillars of the plurality of body pillars;
forming a protective layer on sidewalls of the portions of the body pillars that are exposed, wherein gaps exist between parts of the protective layer of adjacent body pillars of the plurality of body pillars;
removing a remaining part of the third isolation layer along the gaps until the plurality of body layers is exposed;
etching an exposed part of the plurality of body layers along the gaps, to form the plurality of discrete openings in each of the body structures of the plurality of body structures.

13. The method of manufacturing according to claim 12, further comprising: forming a plurality of capacitors, wherein each capacitor of the plurality of capacitors is connected to a source of a vertical gate-all-around transistor of the plurality of vertical gate-all-around transistor or a drain of the vertical gate-all-around transistor of the plurality of the vertical gate-all around transistor; and
filling gaps with a second isolation layer.

* * * * *